(12) United States Patent
Morton et al.

(10) Patent No.: US 12,035,644 B2
(45) Date of Patent: Jul. 9, 2024

(54) ARCHITECTURES FOR QUANTUM INFORMATION PROCESSING

(71) Applicant: QUANTUM MOTION TECHNOLOGIES LIMITED, London (GB)

(72) Inventors: John Morton, London (GB); Michael Fogarty, London (GB); Simon Schaal, London (GB); Sofia Patomaki, London (GB)

(73) Assignee: QUANTUM MOTION TECHNOLOGIES LIMITED, London (GB)

( * ) Notice: Subject to any disclaimer, the term of this patent is extended or adjusted under 35 U.S.C. 154(b) by 451 days.

(21) Appl. No.: 17/593,530

(22) PCT Filed: Mar. 10, 2020

(86) PCT No.: PCT/GB2020/050570
§ 371 (c)(1),
(2) Date: Sep. 20, 2021

(87) PCT Pub. No.: WO2020/188240
PCT Pub. Date: Sep. 24, 2020

(65) Prior Publication Data
US 2022/0164695 A1 May 26, 2022

(30) Foreign Application Priority Data
Mar. 21, 2019 (GB) .................................... 1903884

(51) Int. Cl.
*H01L 29/06* (2006.01)
*G06N 10/40* (2022.01)
(Continued)

(52) U.S. Cl.
CPC ............. *H10N 99/05* (2023.02); *G06N 10/40* (2022.01)

(58) Field of Classification Search
CPC ...... H10N 99/05; G06N 10/00; H01L 29/423; H01L 29/66977; B82Y 10/00
See application file for complete search history.

(56) References Cited

FOREIGN PATENT DOCUMENTS

| TW | 200945220 A | 11/2020 |
|---|---|---|
| WO | 2020188241 A1 | 9/2020 |

OTHER PUBLICATIONS

Fogarty M A et al: "Integrated silicon qubit platform with single-spin addressability, exchange control and robust single-shot singlet-triplet readout", arxiv.org, Cornell University Library, 201 Olin Library Cornell University Ithaca, NY 14853, Aug. 11, 2017 (Aug. 11, 2017) (Year: 2017).*

(Continued)

*Primary Examiner* — Niki H Nguyen
(74) *Attorney, Agent, or Firm* — Fletcher Yoder, P.C.

(57) ABSTRACT

A device for quantum information processing is disclosed herein. According to examples, the device comprises a first plurality of confinement regions for confining spinful charge carriers for use as data qudits. The device further comprises a second plurality of confinement regions for confining spinful charge carriers for use as ancillary qudits, each confinement region of the second plurality of confinement regions couplable to measurement apparatus for measuring an ancillary qudit. The device further comprises a third plurality of confinement regions for confining spinful charge carriers, each confinement region of the third plurality of confinement regions situated between a first confinement region of the first plurality of confinement regions and a second confinement region of the second plurality of confinement regions and for use in mediating interactions (Continued)

between a data qudit of the first confinement region and an ancillary qudit of the second confinement region. The device further comprises one or more charge reservoirs. Each confinement region of the third plurality of confinement regions is couplable to a charge reservoir of the one or more charge reservoirs. Methods for operating a device for quantum information processing, and computer-readable media, are also described herein.

20 Claims, 11 Drawing Sheets

(51) Int. Cl.
    *H01L 29/08*    (2006.01)
    *H10N 99/00*    (2023.01)

(56) References Cited

OTHER PUBLICATIONS

Baart T A et al: "Coherent spin-exchange via a quantum mediator", arxiv.org, Cornell University Library, 201 Olin Library Cornell University Ithaca, NY 14853, Mar. 10, 2016 (Mar. 10, 2016) (Year: 2016).*
Search Report for Application No. 109109368 dated Jun. 27, 2023.
Fogarty et al., "Integrated silicon qubit platform with single spin addressability, exchange control and robust single-shot singlet-triplet readout," www.nature.com/naturecommunications DOI: 10.1038/s41467-018-06039-x, Feb. 5, 2017, pp. 1-8.
Aliferis et al., "Fault-Tolerant Quantum Computation for Local Leakage Faults," http://arxiv.org/abs/quant-ph/0511065v5 , Jul. 24, 2018, pp. 1-15.
Baart et al., "Coherent spin-exchange via a quantum mediator," arXiv:1603.03433v2 [cond-mat.mes-hall], Mar. 22, 2016, pp. 1-23.
Malinowski et al., "Fast spin exchange between two distant quantum dots," arXiv:1808.09736v1 [cond-mat.mes-hall], Aug. 29, 2018, pp. 1-14.
Cai et al., "A Silicon Surface Code Architecture Resilient Against Leakage Error," https://doi.org/10.22331/q-2019-12-09-212 , Dec. 9, 2019, pp. 1-27.
Fowlet et al., "Surface codes: Towards practical large-scale quantum computation," https://doi.org/10.1103/PhysRevA.86.032324 , Sep. 18, 2012, pp. 1-54.
EP search Report for European Application No. 1903884.3 Mailed Sep. 4, 2019.
Malinowski et al., "Fast spin exchange across a multielectron mediator," Nature communications, Mar. 13, 2019, https://doi.org/10.1038/s41467-019-09194-x , pp. 1-6.
Mehl et al., "Two-Qubit Couplings of Singlet-Triplet Qubits Mediated by One Quantum State," https://arxiv.org/pdf/1403.2910.pdf , Aug. 5, 2014, pp. 1-12.
Srinivasa et al., "Tunable Spin Qubit Coupling Mediated by a Multi-Electron Quantum Dot," https://arxiv.org/pdf/1312.1711.pdf , Feb. 27, 2014, pp. 1-6.
Schirmer et al., "Implementation of controlled multi-qudit operations for a solid-state quantum computer based on charge qudits," https://arxiv.org/pdf/quant-ph/0305052.pdf , May 9, 2003, pp. 1-4.

* cited by examiner

ARCHITECTURES FOR QUANTUM INFORMATION PROCESSING

FOREIGN PRIORITY INFORMATION

This application claims priority to PCT application number PCT/GB2020/050570, filed Mar. 10, 2020, which claims priority to United Kingdom patent application number 1903884.3, filed Mar. 21, 2019.

TECHNICAL FIELD

The present disclosure relates to devices, architectures and systems for use in quantum information processing and storage.

BACKGROUND

The invention described herein is, at least in part, based on quantum mechanics, quantum information and quantum computation for the interested reader, the fundamentals are detailed in "Quantum Computation and Quantum Information" by Michael A Nielsen and Isaac L. Chuang. In particular, this reference contains properties of qubits and the basics of quantum measurements in complementary bases, and provides an introduction to quantum error correction and fault-tolerant quantum computing. This reference also familiarises readers with notations conventionally used in the field of quantum physics.

A quantum computer is a device that processes quantum information, which is a generalisation of classical information (such as discrete classical bits i.e. 0's and 1's which classical computers process. A quantum computer has the potential to be far more powerful than a classical computer for at least some processes because many operations can be performed much more efficiently.

In a computer for the processing of quantum bits, otherwise known as "qubits", each qubit can be placed in one of two states. However, due to the nature of quantum bits, they can also be placed in a superposition of these two states. If every qubit of a computer is placed in a suitable superposition of states, the overall superposition of states in the computer scales as $2^n$ where n is the number of qubits. By placing a computer in this superposition of states, quantum algorithms, such as Grover's algorithm, can be used to solve various problems much more rapidly. This can be viewed as resulting from the fact that, rather than running through each possible state sequentially, the qubits are in all possible combinations of states at the same time. While a qubit may be thought of as a classical 0, a classical 1, or a superposition of the two states, a qudit may be thought of as a 0, 1, ..., n-1 or a superposition of any of the n states.

Universal quantum computers promise a speed-up of processing times for several operations such as factoring large numbers, search algorithms, and quantum simulations, yet the progress of development of such quantum computers is hindered by the required high precision of control of the quantum states.

In terms of qubits, in principle any two-level system that satisfies the qubit operators $\hat{X}=i\hat{\sigma}_x$, $\hat{Y}=-i\hat{\sigma}_y$, and $\hat{Z}=\hat{\sigma}_z$, where $\hat{\sigma}_x$, $\hat{\sigma}_y$, and $\hat{\sigma}_z$ are the Pauli operators, can be used to define a qubit. The eigenstates of the $\hat{Z}$ operator can be, for example, a ground state $|g\rangle$ and an excited state $|e\rangle$. The ground state is the +1 eigenstate of the $\hat{Z}$ operator with $\hat{Z}|g\rangle=+1|g\rangle$, and the excited state is the −1 eigenstate of the $\hat{Z}$ operator with $\hat{Z}|e\rangle=-1|e\rangle$. However, a qubit can exist in a superposition of its eigenstates, $|\psi\rangle=\alpha|g\rangle+\beta|e\rangle$. A measurement of the qubit in the Z basis will typically project the qubit onto either the ground state or the excited state with a probability dependent on the parameters $\alpha$ and $\beta$. A state projection may be intentionally caused by a measurement, or may be unintentionally caused as a result of the qubit's interaction with thus environment. Such unintentional state projections give rise to quantum errors. Qubit errors can thus be modelled by introducing random $\hat{Z}$ phase flip operations or $\hat{X}$ bit flip operations.

A major obstacle to the development of quantum computers is decoherence—unintended interactions of a quantum state with the external world leads to a loss of quantum information. Quantum error correction can be used to protect quantum information from errors due to decoherence and other sources of noise. One can, in effect, construct a logical qubit from a plurality of physical qubits, such that the logical qubit can be processed with more precision than any individual physical qubit.

One approach to building a quantum computer is based on surface codes, operated as stabilizer codes. Surface codes in theory offer significant advantages due to their relatively high tolerance to local errors. In a typical surface code, physical qubits are entangled together using a sequence of physical qubit Control-NoT, (CNOT) operations, with subsequent measurements of the entangled states providing a means for error correction and error detection. A set of physical qubits entangled in this way is used to define a logical qubit, which due to the entanglement and measurement has far better performance than the underlying physical qubits.

For an introduction to surface code quantum computing, including a definition of "plaquettes", the reader is directed towards "Surface codes: Towards practical large-scale quantum computation" by Fowler et al, Physical Review A, Volume 86. Issue 3, 032324, published 18 Sep. 2012.

In a typical two-dimensional surface code architecture, a plurality of "data qubits" are interspersed with a plurality of "ancillary qubits" (also known as "measurement qubits"). A typical surface code architecture 100 is shown in FIG. 1. A plurality of data qubits 110 (shown as black circles) are interspersed with at plurality of ancillary qubits 120 (shown as white circles) in a two-dimensional array of entangled physical qubits. Direct interactions (which may be direct exchange interactions) between the data qubits 110 and ancillary qubits 120 are used to manipulate the quantum information of the architecture 100. Away from the boundaries, each data qubit 110 is coupled to four ancillary qubits 120, and each ancillary qubit 120 couples with four data qubits 110. The ancillary qubits 120 are used to stabilize and manipulate the quantum state of the data qubits 110. Quantum logic gates can be implemented by performing combinations of two-qubit measurements between nearest neighbour qubits involving both a data qubit 110 and an ancillary qubit 120, such as the controlled-NOT gate (CNOT), single qubit operations on data qubits, and measurements on ancillary qubits.

While surface code architectures such as that shown in FIG. 1 are theoretically fault-tolerant, there may still be significant leakages of e.g. charge to physical states outside the computational subspace depending on the nature of the physical system on which the surface code architecture depends. Leakages may be due to, for example, an electron at one site of the array tunneling through to a neighbouring site. Such leakages can lead to errors in computation, which cannot be corrected via the standard surface code protocol.

The present disclosure provides devices, architectures and apparatuses capable of mitigating some of the problems described above.

SUMMARY

According to an aspect of the invention, a device is provided, the device suitable for quantum information processing. The device comprises a first plurality of confinement regions for confining spinful charge carriers for use as data qudits. The device further comprises a second plurality of confinement regions for confining spinful charge carriers for use as ancillary qudits, each confinement region of the second plurality of confinement regions couplable to measurement apparatus for measuring an ancillary qudit. The device further comprises a third plurality of confinement regions for confining spinful charge carriers. Each confinement region of the third plurality of confinement regions is situated between a first confinement region of the first plurality of confinement regions and a second confinement region of the second plurality of confinement regions and is suitable for use in mediating interactions between a data qudit of the first confinement region and an ancillary qudit of the second confinement region. The device further comprises one or more charge reservoirs. Each confinement region of the third plurality of confinement regions is couplable to a charge reservoir of the one or more charge reservoirs.

The device may be usable for surface code quantum information processing. Throughout the following description, the devices disclosed herein and methods for controlling and using the devices have been described with reference to surface code quantum information processing and storage. However, the skilled person would appreciate that the devices disclosed herein may be used with other quantum information processing methods, for example a 2-D colour code scheme.

Advantageously, devices as disclosed herein offer numerous advantages for quantum information processing, as will be appreciated by the skilled person. In particular, the devices enable the mitigation of leakage errors.

The term "leakage error" refers to the state of the quantum system escaping out of the computational subspace. Typical quantum error correction protocols are not designed to handle leakage errors. Without any correction protocols, even if the rate of such leakage errors occurring is extremely small, they will persist and accumulate as the computation goes on, and eventually corrupt the logical qubits stored in the architecture. General schemes to cope with leakage errors have been proposed with various assumptions on the properties of the leakage errors. To correct the leakage errors, one can detect the leakage errors and replace the leaked qubits. Alternatively, one can apply leakage-reduction protocols to all the qubit, which ideally will restore the leaked qubits without affecting the normal qubits. Using these methods, leakage errors can be transformed into computational errors which can be handled by the quantum error correction code. In reality, the sources, effects and the solutions of leakage errors are very hardware-dependent.

The devices described herein are inherently robust against leakage errors. The devices described herein include a third plurality of confinement regions for confining spinful charge carriers, and further include one or more charge reservoirs. Each confinement region of the third plurality of confinement regions is situated between a first confinement region of the first plurality of confinement regions and a second confinement region of the second plurality of confinement regions and is suitable for use in mediating interactions between a data qudit of the first confinement region and an ancillary qudit of the second confinement region. Each confinement region of the third plurality of confinement regions is couplable to a charge reservoir of the one or more charge reservoirs. If a charge carrier leaks to a confinement region of the third plurality of confinement regions from a neighbouring confinement region, then the charge reservoir can be coupled to that confinement structure to reset the charge of the system. In this way, the device is able to mitigate leakage errors.

Throughout the present disclosure, the term "confinement region" has been used. The skilled person would appreciate that such a term should be interpreted broadly as a region in which a charge carrier, treated as a quantum object, can be confined or contained, although an energy boundary to such a confinement region may be adjustable using, for example, electric fields. A confinement structure may permit quantum tunnelling. The term "region" should be understood to have any suitable dimensionality. For example, a confinement region may comprise a quantum dot (which is often considered to be a "zero dimensional" structure, but is more properly a potential well of small, but finite extent in all three dimensions) or a quantum well. A confinement region/confinement structure can therefore be considered as a low-dimensional feature in which a charge carrier may be confined.

Throughout the present disclosure, the term "data qudit" has been used. A data qudit may be considered as a unit of quantum information, but which in the present disclosure is not intended to be read directly using classical readout/measurement apparatus. In contrast, an "ancillary qudit" may be considered as a qudit that is intended for measurement. Careful manipulation of the ancillary qudits may be used to read or process the information stored in data qudits. The terms data qubit and ancillary qubit are data qudits and ancillary qudits respectively for which the only available logical states are 0, 1, or a superposition of 0 and 1.

Throughout the present disclosure, a confinement region of the third plurality of confinement mediator is sometimes referred to as a mediator region or, in one example described herein, as a mediator dot. Such mediator regions are suitable for use in mediating interactions between a data qudit and an ancillary qudit in neighbouring confinement regions.

A mediated interaction may be understood to mean a mediated exchange coupling between neighbouring confinement regions such that spinful charge carriers nay (when the device is in use) tunnel between sites.

The term "mediated interaction" as used herein would be understood by the skilled person to comprise an interaction affecting the data qudit and the ancillary audit at substantially the same time. For example, the mediator region is configured to interact with the neighbouring data region and neighbouring ancillary region at substantially the same time when tuned to the correct energy levels to enable a coupling interaction between the data region and the mediator region, and between the mediator region and the ancillary region and thus, by extension, forms a coupling between the data and ancillary regions.

In the devices described herein, each confinement region of the third plurality of confinement regions is couplable to a charge reservoir of the one or more charge reservoirs. Couplable in this sense may be considered to mean chargeably couplable. For example, a charge reservoir may be coupled to a confinement region of the third plurality of confinement regions, such that a charge carrier may travel between the confinement region and the charge reservoir.

The coupling may be achieved by, for example, tuning an interaction strength between the confinement region and the charge carrier.

Each qudit may comprise a qubit.

Each confinement region of the first plurality of confinement regions may comprise a quantum dot (often referred to herein as a "data dot"). Each quantum dot of the first plurality of confinement regions may have a diameter of between 5 nm-100 nm, for example between 28 nm and 60 nm, to provide a convenient size for compatibility with standard CMOS processing.

Each confinement region of the second plurality of confinement regions may comprise a quantum dot (often referred to herein as an "ancilla dot").

Surface code architectures have been proposed for leading quantum information processing platforms including superconducting qubits and trapped ions. It is estimated that more than $2 \times 10^3$ qubits with gate error rate $\sim 10^{-3}$ might be needed to perform a non-trivial Shor's factoring algorithm using surface codes. If one were to attempt to construct a device for surface code processing using superconducting qubits, the resultant device size would be very large (on the order of a metre squared in area). For non-solid-state qubits such as trapped ions, the required architecture would likely be orders of magnitude larger than that for superconducting qubits. Manufacturing quantum processors of such size and/or creating the required cryogenic environments are far beyond today's technology. However, a quantum information processing device based on quantum dots (for example, silicon quantum dots), and scaled for a similar number of qubits cart be made much smaller than that for superconducting qubits (on the order of a millimetre squared in area). Such high qubit density and the possibility of utilising the technologies available to the existing semiconductor integrated circuit industry make silicon quantum dots spin (SS) qubits a promising candidate for a scalable quantum information processing device.

Each confinement region of the second plurality of confinement regions may comprise a pair of quantum dots. The provision of a pair of quantum dots gives rise to several advantages, as explained further below in the detailed description.

Each confinement region of the third plurality of confinement regions may comprise a quantum dot (which may be referred to as a "mediator quantum dot" or a "mediator dot"). The mediator quantum dot may be suitable for confining one or more spinful charge carriers, for example two spinful charge carriers. In some examples, each confinement region of the third plurality of confinement regions is suitable for confining four spinful charge carriers. Charge carriers confined to the mediator dots are not intended to carry quantum information.

Scaling up devices with SS qubits poses a number of challenges. The high qubit density of SS qubits leads to challenges in packing the classical control lines, avoiding cross-talk and heat dissipation. For example, if one considers the traditional architecture of FIG. 1 to comprise silicon quantum dots, then noise and other errors may be introduced due to leakage between the dots, and the difficulty in interacting, using classical control lines, with individual quantum dots without disturbing the others is prohibitive. While several suggestions have been made in the art as to how such SS qubit-based surface code architectures could be implemented, each of these suffers from their own drawbacks. More importantly, none of these architectures addresses a problem of how to mitigate leakage errors, which refers to the quantum system escaping out of the computational subspace. Controls of SS qubits involve tuning tunnelling barriers, changing on-site energies and/or shuttling electrons from one location to another, and all of these operations are prone to electrons ending up on the wrong quantum dots, which is equivalent to a charge leakage error. In the known surface code architectures, successful implementations of error correction cycles rely heavily on the assumption that the system is in the right charge configuration. If one charge leakage event happens, then the error might propagate in an uncontrollable way. Since such leakage errors cannot be corrected (or may even be exacerbated) by the usual quantum error correction protocols, they will accumulate and eventually corrupt the surface code even if the probability of these leakage errors is very small.

Advantageously, in examples the devices herein include a plurality of mediator dots, with each mediator dot of the plurality of mediator dots positioned for mediating at interaction between a neighbouring data dot and a neighbouring ancilla dot. Accordingly, the mediator dots help to space out the data dots and the ancilla dots while still enabling interactions between the data dots and ancilla dots. This spacing out of the data dots and the ancilla dots helps to isolate the data dots and ancilla dots sufficiently such that classical control lines can be used to address individual qubits. Furthermore, in examples each mediator dot is couplable to a charge reservoir to reset the device, thereby obviating leakage errors.

In examples, at least some of the mediator dots are elongated quantum dots. Each mediator dot may therefore be elongated in substantially the direction of the line on which the neighbouring data dot and the ancillary data dot are located. That is, each mediator dot may be elongated in the direction of the neighbouring data dot and the neighbouring ancilla dot. Elongated mediator dots help to further space out the data dots and the ancilla dots allowing positioning of classical control lines in between.

Each mediator dot/mediator quantum dot may have a first dimension of between 5-100 nm, and no smaller than the diameter of the data dot, and a second dimension of between 50 nm-1000 nm. It should be noted that the lower limit of the second dimension is also generally constrained by the chosen value of the first dimension should that be smaller than 50 nm.

According to examples of the devices described herein, each confinement region of the third plurality of confinement regions is situated between a first confinement region of the first plurality of confinement regions and a second confinement region of the second plurality of confinement regions; and the distance between the first confinement region and the second confinement region may be between 5 nm and 1000 nm.

According to examples of the devices described herein, each confinement region of the third plurality of confinement regions is situated between a first confinement region of the first plurality of confinement regions and a second confinement region of the second plurality of confinement regions; and the distance between the confinement region of the third plurality of confinement regions and the first confinement region is between 0.5 nm and 20 nm; and the distance between the confinement region of the third plurality of confinement regions and the second confinement region is between 0.5 nm and 20 nm.

The spinful charge carriers may be electrons. The spinful charge carriers may be holes. The spinful charge carriers may be donor or acceptor ions implanted at the data qubit locations.

The device may further comprise a measurement device/measurement apparatus. The measurement apparatus may be configured to measure a state of one or more ancillary qudits.

The device may be for surface code quantum information processing.

The device may be configured to maintain a charge stability across the first plurality of confinement regions and the second plurality of confinement regions.

The device may further comprise a contoller configured to cause a magnetic field to be applied to the first and second pluralities of confinement regions, to separate energy levels of the spin states of the charge carriers in the first and second pluralities of confinement regions.

The device may further comprise a controller configured to cause an oscillating magnetic field to be applied to the first and second pluralities of confinement regions The oscillating magnetic field may have a frequency substantially matching a Zeeman splitting of the charge carriers in the first plurality of confinement regions. Such an oscillating magnetic field can be used to perform single-qubit logic gate operations.

The device may further comprise a controller configured to cause at least one confinement region of the third plurality of confinement regions to couple to a charge reservoir to enable a transfer of at charge carrier between the charge reservoir and the at least one confinement region of the third plurality of confinement regions The device may further comprise a plurality of micromagnets, each micromagnet arranged in proximity to a confinement region of the first plurality of confinement regions. The skilled person would appreciate that the term "micromagnet" is to be construed as any suitably sized magnet, for example a nano-scale sized magnet, and is not to be construed as limited only to a micro-scale sized magnet. Advantageously, a micromagnet can be used to provide a highly localised magnetic field gradient to a confinement region of the first plurality of confinement regions. Such a magnetic field gradient is useful for speeding up the time required to implement quantum logic gate operations.

According to an aspect of the invention, a method of operating a device as described herein is provided. The method comprises causing a confinement region of the third plurality of confinement regions to couple to a charge reservoir of the one or more charge reservoirs to enable a transfer of a charge carrier between the charge reservoir and the at least one confinement region of the third plurality of confinement regions. By coupling the confinement region to the charge reservoir, excess charge carriers in the confinement region can be removed, or additional charge carriers can be provided to the confinement region, thereby enabling leakage errors in the device to be corrected and ensuring charge stability is maintained.

The causing of the confinement region of the third plurality of confinement regions to couple with the charge reservoir of the one or more charge reservoirs may comprise: coupling the confinement region of the third plurality of confinement regions to the charge reservoir.

The causing of the confinement region of the third plurality of confinement regions to couple with the charge reservoir of the one or more charge reservoirs may comprise causing the coupling as part of a stabiliser operation. Advantageously, this helps to reduce errors in performing stabiliser operations as charge migration errors are regularly corrected.

According to an aspect of the invention, a computer-readable medium is provided, the computer-readable medium having instructions stored thereon which, when executed by a processor, cause the process to perform a method as described herein. The computer-readable medium may comprise a non-transitory computer-readable medium.

A computer program and/or the code/instructions for performing such methods as described herein may be provided to an apparatus, such as a computer, on a computer readable medium or computer program product. The computer readable medium could be, for example, an electronic, magnetic, optical, electromagnetic, infrared, or semiconductor system, or a propagation medium for data transmission, for example for downloading the code over the Internet. Alternatively, the computer readable medium could take the form of a physical computer readable medium such as semiconductor or solid-state memory, magnetic tape, a removable computer diskette, a random access memory (RAM), a read-only memory (ROM), a rigid magnetic disc, and an optical disk, such as a CD-ROM, CD-RW or DVD.

Many modifications and other embodiments of the inventions set out herein will come to mind to a person skilled in the art to which these inventions pertain in light of the teachings presented herein. Therefore, it will be understood that the disclosure herein is not to be limited to the specific embodiments disclosed herein. Moreover, although the description provided herein provides example embodiments in the context of certain combinations of elements, steps and/or functions may be provided by alternative embodiments without departing from the scope of the invention.

BRIEF DESCRIPTION OF THE FIGURES

Illustrative embodiments of the present disclosure will now be described, by way of example only, with reference to the drawings. In the drawings.

Throughout the description and the drawings, like reference numerals refer to like parts.

DETAILED DESCRIPTION

The present disclosure relates to an improved device for quantum information processing. Whilst various embodiments are described below, the invention is not limited to these embodiments, and the skilled person would appreciate that variations of these embodiments may be made without departing from the scope of the invention.

For the purposes of discussion, devices are hereafter described for the processing of quantum information based on qubits, and in particular silicon quantum dot spin qubits in which electron spin states contain information. Accordingly, devices are described which comprise: a first plurality of quantum dots (data dots) for confining electrons for use as data qubits, a second plurality of quantum dots (or pairs of quantum dots), also referred to as ancilla dots, for confining electrons for use as ancillary qubits; a third plurality of mediator quantum dots for confining electrons, each mediator quantum dot situated between a data dot and an ancilla dot and for use in mediating an interaction between the data dot aid the ancilla dot; and one or more charge reservoirs, wherein each mediator quantum dot is couplable to a charge reservoir.

Figure 2:
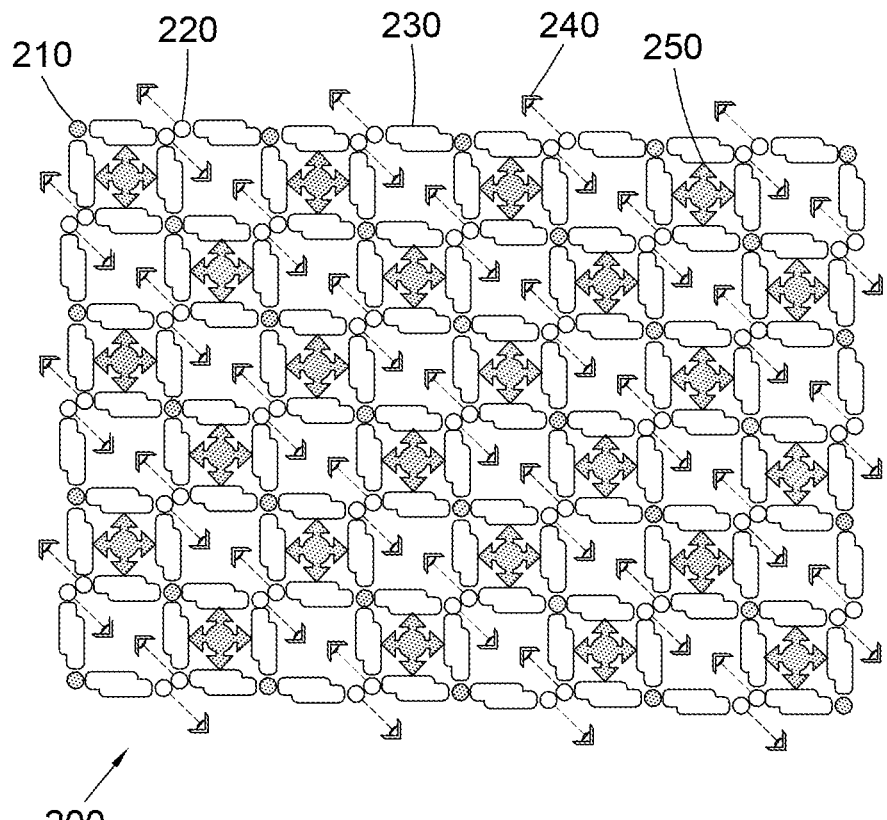
FIG. 2 is an illustration of a surface code architecture according to an embodiment of the present disclosure.

FIG. 2 shows a diagram of a two-dimensional array 200 according to an example. The array 200 may be formed within/on a device for quantum information processing. The surface code architecture 200 of the present example includes a first plurality of confinement regions for confining spinful charge carriers for use as a data qubit. In particular, the first plurality of confinement regions comprises a plurality of confinement structures which, in the present example, are quantum dots and hereafter referred to in relation to this example as data dots 210.

Each data dot 210 is occupied by an electron (not shown), the spin state of which represents a physical data qubit. A constant magnetic field may be passed through the array 200, substantially perpendicular to the plane of the array (in what will be considered as the Z direction) in order to remove the degeneracy of the spin states of the electrons in the data dots. The array 200 is considered in this example to extend in the X and Y directions.

A single-qubit logic gate operation can be performed via electron spin resonance (ESR), in which an oscillating magnetic field perpendicular to the Z direction (for example, in the X direction) with frequency matching the Zeeman splitting of the electron spin is applied to drive its rotation. Single qubit addressability may be achieved by shifting the resonance frequency of individual spins via stark shifts. The fidelity of a single-qubit ESR gate has been demonstrated to be as high as 99.5%, but may be relatively slow, depending on the magnitude of the applied oscillating magnetic field.

For the purposes of this example, the data dots 210 are considered to be approximately circular in shape. The diameter of the data dots 210 is around 50 nm. Such a small size will lead to large coulomb repulsions U~10 THz, preventing double-spin occupation of the data dots.

The array 200 further includes a second plurality of confinement regions for confining spinful charge carriers for use as ancillary qubits. In particular, each confinement region of the second plurality of confinement regions comprises two confinement structures which in the pre-ent example comprise quantum dots. That is, in the example shown in FIG. 2, each confinement region of the second plurality of confinement regions comprises a pair of quantum dots 220, which are referred to hereafter as ancilla dots 220. Each ancilla dot is couplable to a measurement apparatus (denoted as 240) for measuring a quantum state of an electron stored in the ancilla dot. Each ancilla dot 220 of the present example is of substantially the same size as the data dots 210. That is, each ancilla dot 220 has a diameter of approximately 50 nm.

An ancillary qubit is represented by the spin state of the electron pair in the pair of ancilla dots 220. By initialising the device in a singlet state, if an error results in a failed stabiliser check, then the spin state of the electron pair in the ancilla dots will be transformed into a triplet state. Accordingly, one can use Pauli spin blockade spin dependent tunnelling from one dot to another to determine the outcome of the stabiliser check.

The measurement devices 240 couplable to the ancilla dots 220 are for dispersive readout of the tunnelling outcome. The ancillary qubits are initialised by configuring the ancilla such that one of the two available quantum dots 220 is doubly occupied with both electrons. Here, the ground state is the singlet, which can be rapidly prepared through 'hot-spot' relaxation near the (1,1)-(0,2) charge transition.

Such double-dot ancillary qubits have several advantages over single-dot ancillary qubits.

Firstly, when a single ancilla dot 220 is used instead of a pair of ancilla dots 220, measurement readout of the single-dot ancilla is typically achieved via spin dependent tunnelling to a neighbouring readout dot. In surface codes, this means the ancilla dot needs to have a readout dot next to it as well as the four data dots. On the other hand, for a double-dot ancilla such as in array 200, each ancilla dot 220 will only connect to two data dots 210 and the other ancilla dot 220. Accordingly, when a double-dot ancilla is used, the two-dimensional array is much less cluttered than when a single-dot ancilla is used.

Secondly, whereas a single-dot ancilla can be used to detect X (or Z) errors when prepared and measured in the Z (X) basis, the double-dot ancilla can be used to detect both X errors and Z errors when prepared in the singlet state since both X and Z errors will turn the singlet state into one of the triplet states. This means that one can globally initialised all ancilla to the same states and measure them in the same way irrespective of which stabiliser check they correspond to. Without the need to change measurement basis, one also mitigates the need to apply Hadamard gates to the ancilla. Unlike in the single-dot ancilla case, initialisations and measurements in Z (X) basis are immune to Z (X) errors.

Thirdly, operations that are symmetric under the exchange of the two spins cannot bring the quantum state out of the singlet (exchange-antisymmetric) or the triplet (exchange-symmetric) subspace. Hence, global ESR (single qubit gates) can be applied to all the data qubits without affecting the double-dot ancilla, which is useful in switching between X and Z stabiliser checks of the surface code. The initialisations and measurements of the double-dot ancilla will also be less susceptible to noise due to the residue exchange interactions between the two ancilla dot spins.

Fourthly, interactions between the ancilla double dot and two data qubits can happen substantially in parallel, halving the time required to perform stabilizer checks.

The array 200 further includes a third plurality of confinement regions for confining spinful charge carriers in the example of FIG. 2, this third plurality of confinement regions comprises a plurality of elongated two-electron quantum dots, which are used for mediating the interactions between a data qubit and an ancillary qubit. That is, each confinement region of the third plurality of confinement regions comprises an elongated quantum dot situated between a data dot and an ancilla dot, hereafter referred to as a mediator dot 230, and wherein the mediator dot confines two electrons.

For the purposes of using the architecture of 200 of FIG. 2, the electrons confined in the mediator dots 230 do not carry any quantum information—the computational subspace of the architecture 200 of FIG. 2 comprises the spin states of the electrons in the data dots 210 and the ancilla dots 220.

For processing quantum information, two-qubit gates are required, such that an ancillary qubit and a data qubit interact. The two-qubit gates are achieved via mediated exchange coupling between data dots 210 and ancilla dots 220 via mediator dots 230, and this is illustrated in FIG. 3.

Figure 3:
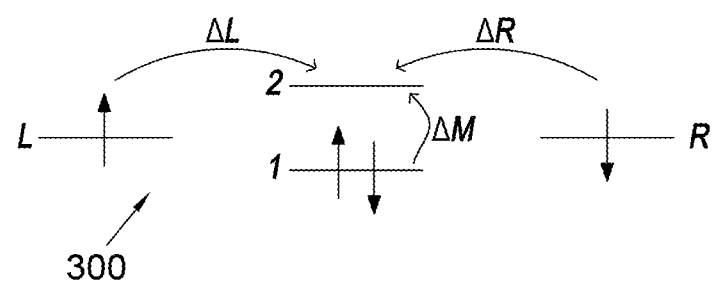
FIG. 3 illustrates energy levels and transitions between quantum dots in the architecture of FIG. 2.

A three-dot system is illustrated in FIG. 3. FIG. 3 depicts energy levels of three quantum dots, with dot L on the left-hand side, a mediator dot 230 in the middle, and dot R on the right-hand side. The left dot L may represent a data dot 210 and the right dot R may represent an ancilla dot 220 (i.e. one half of a pair of ancilla dots 220). Alternatively, the left dot L may represent an ancilla dot 220 and the right dot R may represent a data dot 210. There are four electrons in this three-dot model system. Each side dot (L and R) is filled with one electron in orbital L/R. The middle mediator dot 230 confines two electrons in orbital 1 and no electrons in orbital 2 in its ground state. For the purposes of this discussion, it is assumed that the electron-electron repulsion energies at the side dots are so large (due to their small size) that there can be no double occupancy of electrons in the side dot. The arrows in FIG. 3 represent possible electron jumps that may happen, and the labels indicate the energy cost of the jump from the ground state.

The electrons in the side dots interact with an exchange coupling strength of $$J = -2\left(\frac{t_{R2}^A t_{R1} t_{L1}^A t_{L2}}{\Delta_R \Delta_M \Delta_L} + c.c.\right) \quad \text{(Equation 1)}$$

where $t_{ab}$ is the tunnelling energy from orbital a to orbital b and $\Delta_R$, $\Delta_M$ and $\Delta_L$ are the energies required for the various electron jumps shown in FIG. 3.

In this example, the mediator dots 230 have a size of around 50 nm by 300 nm, which implies a mediator quantum jump energy of $\Delta_M \sim 10$ GHz. The spacings between the mediator dots 230 and the data/ancilla dots are around 10 nm, leading to tunnelling energy of $t \sim 1$ GHz. By tuning the on-site energy of the mediator dot 230, one can change the value of $\Delta_{R/L}$ at the same time and hence control the strength of the exchange interaction $\Delta_{R/L}$ is lower-bounded by the tunnelling energy and upper-bounded by the coulomb repulsion energy of the data dots. Accordingly, one may choose for the purposes of this example $\Delta_{R/L} = \Delta_{on} = 10$ GHz for turning on the exchange interaction, and $\Delta_{R/L} = \Delta_{off} = 3$ THz for turning off the exchange interaction.

Using Equation 1, the strength of the exchange interaction is $$J_{on} = \frac{t^4}{\Delta_{on}^2 \Delta_M} \approx 1 \text{ MHz} \quad \text{(Equation 2)}$$

when on, and the residue strength is $$J_{off} = \frac{t^4}{\Delta_{off}^2 \Delta_M} \approx 10 \text{ Hz} \quad \text{(Equation 3)}$$

when off. Such small residue exchange interactions will lead to an error with a probability on the order of $$\frac{J_{off}}{J_{on}} \approx 10^{-5} \quad \text{(Equation 4)}$$

well below the threshold of the surface codes and hence can be safely ignore in the remainder of the discussion.

To control mediated exchange, one needs only to tune the on-site energy of the mediator dots without needing to tune the tunnelling energy between dots. Advantageously, this means that tunnelling gates do not need to be implemented between the dots, which may be difficult due to the small feature sizes of the tunnelling gates and would increase the cluttering of classical control lines.

If the applied (Z-directional) magnetic field contains a gradient (or if there is a gradient in the g-factors) then the side dots L and R will have different Zeeman splittings, which will be denoted for the purposes of this discussion as $\Omega$. When $\Omega$ is tuned to satisfy $\Omega \ll J$, the exchange interaction enables a $\sqrt{\text{SWAP}}$ gate to be implemented. This will be demonstrated briefly here.

The Hamiltonian for the interaction of two spin states can be modelled as $$H = \frac{1}{2}(E_1 Z_1 + E_2 Z_2) + \frac{1}{2}\text{SWAP} \quad \text{(Equation 5)}$$

The first term of Equation 5 can be referred to as $H_0$ and represents Zeeman splitting. The second term can be referred to as $H_{ex}$ and represents an exchange interaction. The Zeeman splitting $H_0$ can be further split into:

$$\frac{1}{2}(E_1 Z_1 + E_2 Z_2) = \frac{E_z}{2}(Z_1 + Z_2) + \frac{\Omega}{2}(Z_1 - Z_2) \quad \text{(Equation 6)}$$

where $$E_z = \frac{E_1 + E_2}{2}, \Omega = \frac{E_1 - E_2}{2}. \quad \text{(Equations 7)}$$

The first term on the right hand side of Equation 6 can be refined to as $H_Z$, the average Zeeman splitting. The second term on the right hand side of Equation 6 can be referred to as $H_\Delta$, the "Zeeman splitting gradient".

In the regime in which $\Omega \ll J$, the Hamiltonian operator $H_Z$ commutes with the Hamiltonian operator $H_{ex}$ and hence, in the interaction picture (rotating frame), the exchange Hamiltonian can be written as.

$$H_{ex;I} = e^{iH_0 t} H_{ex} e^{-iH_0 t} = H_{ex} \quad \text{(Equation 8)}$$

Accordingly, to perform the exchange interaction in the rotating frame is just the same as performing the exchange interaction in the lab frame. The evolution operator due to $H_{ex}$ is given by $$U_{ex}(t) = e^{-tH_{ex}t} = e^{-iSWAP\frac{J_t}{2}} \quad \text{(Equation 9)}$$

A SWAP gate corresponds to $$\frac{J_t}{2} = \frac{\pi}{2}, \text{ and a } \sqrt{SWAP}$$

gate corresponds to $$\frac{J_t}{2} = \frac{\pi}{4}$$

Errors in applying the exchange interaction due to imprecise pulse timing or charge fluctuations have been analysed by the inventors and found to be negligible.

Figure 4:
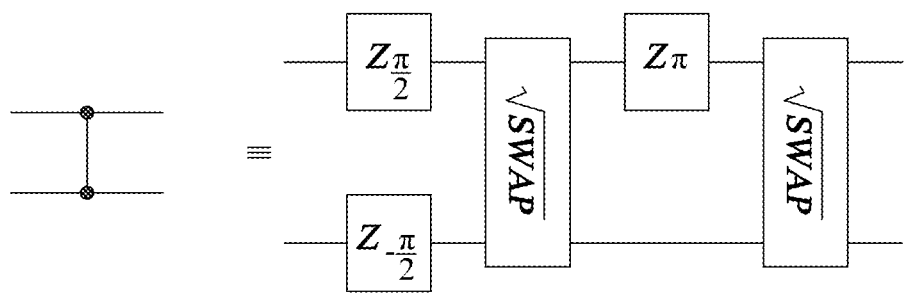
FIG. 4 shows a quantum circuit diagram for implementing a Control-Z gate.

A combination of single-qubit Z rotations and $\sqrt{SWAP}$ gates can be used to implement a Control-Z gate. A quantum circuit illustrating the implementation of a Control-Z gate using single-qubit Z rotations and $\sqrt{SWAP}$ gates is illustrated in FIG. 4.

The fidelity of such mediated exchange interactions between quantum dots 210 and 220 could be further improved if one constructs the architecture 200 of FIG. 2 on an isotropically purified silicon substrate due to its nuclear-spin-free environment.

To address a single qubit, one needs the difference between that qubit's resonant frequency and those of other qubits to be larger than the ESR peak, width of around 2 kHz. To achieve this using an electrical gated stark shift, one needs a change of top gate voltage of ~0.1 mV which roughly corresponds to a shift of the on-site energy by around 5 GHz. This is much smaller than $\Delta_{off}$~3 THz, and so will not lead to any unwanted exchange interaction when one tries to implement a one qubit logic gate.

The array 200 further includes several local charge reservoirs 250. As shown in FIG. 2, each charge reservoir 250 is couplable to four mediator dots 230. The charge reservoirs 250 acts as a source and drain of electrons. When the energy levels of the quantum dots and the reservoirs are tuned to the right level, one may wait for the system to relax to its ground state to initialise the system.

The charge reservoirs 250 can also be used to restore the charge configuration of the system as will be shown further below.

While above the use of electron spin resonance has been discussed in relation to implementing single-qubit logic gates, an alternative method to implement single-qubit gates is via electric dipole spin resonance (EDSR). Although not shown in FIG. 2, a micromagnet (1300, FIG. 13) can be placed in the proximity of a quantum dot to create a magnetic field gradient. The micromagnet may be nano-scale sized, or any other suitably sized magnet. As the electron in the quantum dot is moved using an oscillating electric field, the electron itself will experience an effective oscillating magnetic field which in turn drives the spin rotation. EDSR can be more than sin order of magnitude faster (>10 MHz) than ESR. Single-qubit EDSR gates with fidelity of around 99.9% are achievable.

In order to perform quantum information processing using such a surface code architecture, there is no need to apply any single-qubit gates to the ancilla dots 220. Hence, there is also no need to place any micromagnets at the ancilla dots 220. By only placing micromagnets at the data dots 210, one can create a large Zeeman splitting gradient between the data dots 210 and the ancilla dots 220. When $\Omega \gg J$, there is a dipole-dipole like interaction between the two dots mediated by the exchange interaction, which can be used to implement $$S = \frac{1}{\sqrt{2}} (J_1 J_2 + i Z_1 Z_2).$$

A brief explanation of ow S may be implemented will now follow.

Using Equation 5, the matrix describing operator $H_0$ (without exchange interactions) is given by $$H_0 = \begin{pmatrix} E_z & 0 & 0 & 0 \\ 0 & \Omega & 0 & 0 \\ 0 & 0 & -\Omega & 0 \\ 0 & 0 & 0 & -E_z \end{pmatrix} \quad \text{(Equation 10)}$$

Accordingly, $E_z$ determines the eigenenergies in the parallel spin subspace, while $\Omega$ determine the eigenenergies in the anti-parallel spin subspace. The exchange Hamiltonian can be represented using the matrix:

$$H_{ex} = \frac{J}{2} \begin{pmatrix} 1 & 0 & 0 & 0 \\ 0 & 0 & 1 & 0 \\ 0 & 1 & 0 & 0 \\ 0 & 0 & 0 & 1 \end{pmatrix}. \quad \text{(Equation 11)}$$

In the parallel spin subspace, the energy of both states will be shifted up by J/2. In the anti-parallel spin subspace, if $\Omega \gg J$ then $H_{ex}$ can be treated as a perturbation of $H_0$. Using first order perturbation theory, the shift in eigenenergies for the anti-parallel spin states are 0.

Hence, to the first order approximation, where the eigenstates do not change and one only considers first order shifts in eigenenergies, the exchange Hamiltonian (which to the first order approximation is the shift in eigenenergies) becomes $$H_{ex} = \frac{J}{2} \begin{pmatrix} 1 & 0 & 0 & 0 \\ 0 & 0 & 0 & 0 \\ 0 & 0 & 0 & 0 \\ 0 & 0 & 0 & 1 \end{pmatrix} \quad \text{(Equation 12)}$$

which is a dipole-dipole interaction. Note that this also commute with $H_0$ hence its rotating frame form is the same as its lab form.

Allowing this Hamiltonian to evolve for a time period of $\pi/J$ leads to the operator S which can be represented as $$S \propto \begin{pmatrix} 1 & 0 & 0 & 0 \\ 0 & -i & 0 & 0 \\ 0 & 0 & i & 0 \\ 0 & 0 & 0 & 1 \end{pmatrix} \quad \text{(Equation 13)}$$

in matrix form

Figure 5:
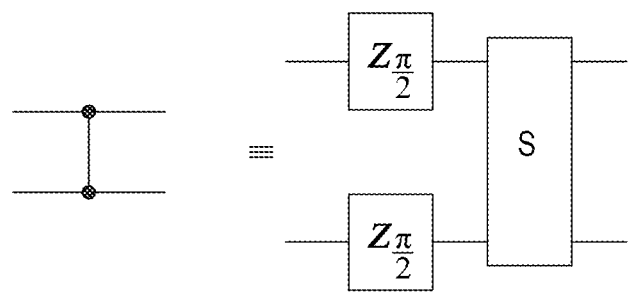
FIG. 5 shows a quantum circuit diagram for implementing a Control-Z gate.

Accordingly, when micromagnets are positioned in the vicinity of the data dots, a Control-Z gate can be implemented using an S operation. A quantum circuit for implementing the Control-Z gate using the S operation and single-qubit Z rotations is illustrated in FIG. 5.

Since in the architecture described herein such as architecture 200, the micromagnets are spaced out by the mediator dots and the ancilla dots, the problem of stray magnetic fields affecting other data dots is greatly reduced compared to a densely packed structure having no mediator dots.

Micromagnets can be damaging to any architectures involving electron shuttling because moving electrons within the stray fields will rotate the spin of the shuttled electron. In the architectures described herein, the intentional shuttling of electrons only happens at the ancilla double dots 220 during read-out, where there are reasonable distances from any micromagnets and the shuttled distance is very short. Hence, the noise due to micromagnets in the shuttling process at the ancilla dots 220 is negligible.

In some examples, one or more of the single-qubit Z rotations may be performed virtually. That is, some of the Z-rotations can be implemented in a virtual way by shifting the rotating reference frame by a given phase. Such Z rotations are essentially error-free and require zero time. This will correspond to adding a phase offset to any subsequent X, Y gate pulses, and switching all the subsequent two-qubit gates into the new rotating frame after the virtual Z rotation.

To summarise so far, a device comprising an architecture 200 for implementing a surface code has been described, along with two ways of implementing Control-Z gates on the architecture.

A brief discussion of leakage errors in relation to the architecture 200 of FIG. 2 will now follow.

In the architecture of FIG. 2, the computational subspace is the whole spin space of the electrons in the data dots 210 and the ancilla dots 220 in the ground charge configuration. Any leakage errors in such an architecture are caused by charge migrations, which take the architecture from the charge ground states to a higher energy charge state. The charge ground state is only coupled to higher energy charge states during exchange interactions (that is, when two-qubit gate interactions are being performed) and so only leakages that occur during exchange interactions are considered in this discussion.

More specifically, if one considers the three-dot system described above in relation to FIG. 3, using ($n_L$; $n_M$, $n_R$) to indicate the charge number on the dot L, mediator dot and dot R respectively, a leakage error corresponds to going from the ground charge configuration (1; 2; 1) to a higher energy charge configuration (1; 3; 0) or (0; 3; 1). Recall that the electron-electron repulsion energies in the qubit dots are much higher than any other energies in the architecture 200, and so double occupancies in data dots 210 or ancilla dots 220 are heavily suppressed such that one does not need to consider migrations of charges from the mediators to the data dots 210 or ancilla dots 220 when starting in the ground state.

Any leaked states will naturally decay back to a lower energy state via various relaxation mechanisms, whose time scale is indicated by the $T_1$ time of charge qubits in semiconductor quantum dots. The charge relaxation time in Si/SiGe double quantum dots has been measured elsewhere, showing strong dependence on the tunnelling energy between the orbitals and weak dependence on the detuning between the orbitals. For the tunnelling energy regime that is of interest in the present discussion for the architecture 200 of FIG. 2 (t~1 GHz), the relaxation time is around 10 ns, which is much shorter than the other time scales in the set-up (all the gates operate at a microsecond time scale). Hence, one can assume that once a leakage error occurs during the exchange interaction, in which a charge escapes from a data dot 210 or an ancilla dot 220, a relaxation process quickly take place, in which an electron in one of the adjacent mediator dots (not necessarily the mediator dot to which the electron escapes to) hops down to till the "empty" data dot 210 or ancilla dot 220. Such a relaxation process hence restores the data dots 210 and the ancilla dots 220 back into the singly occupied state, and thus back into the computational subspace.

Accordingly, as relaxation processes return charge carriers into the computational subspace, any leakage errors can be seen as a computational error to be handled by the surface code without additional overheads such as leakage error detection and active correction or the application of any leakage reduction protocols. The architecture 200 of FIG. 2 is therefore inherently robust against leakage errors.

After a relaxation process restores the charges to the data dots 210 or ancilla dots 220, there can be missing or extra electrons in the mediator dots 230, which will result in faulty exchange gates. However, each mediator dot 230 can be coupled to a charge reservoir (which may be the same charge reservoir as initially used to populate the quantum dot array) to restore a missing electron to the mediator dot 230 or remove an extra electron from the mediator dot 230. Since the electrons in the mediator dots 230 are outside of the computational subspace (i.e. are not viewed as carrying any relevant quantum information), such a coupling to a charge reservoir is highly unlikely to introduce any further errors.

Figure 1:
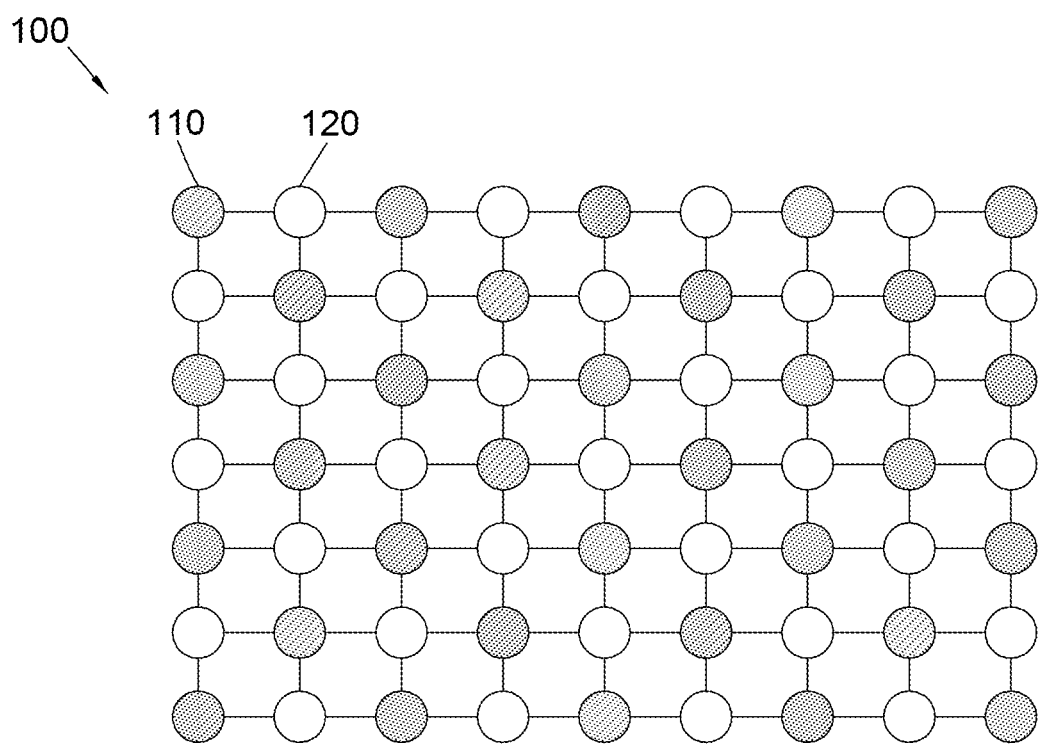
FIG. 1 is an illustration of a typical, known, surface code architecture comprising data qudits and ancillary qudits.

Unlike in the architecture 200 of FIG. 2, in architectures such as architecture 100 of FIG. 1 which rely on direct exchange interactions between data dots 110 and ancilla dots 120 (that is, without any mediating interactions), any electrons that leak from e.g. a data dot 110 will invariably migrate to an ancilla dot 120. Even if one were to attempt to restore the leakage error by connecting the data dots 10 or ancilla dots 120 to a charge reservoir, the quantum information stored in the qubits would become corrupted.

Figure 6A:
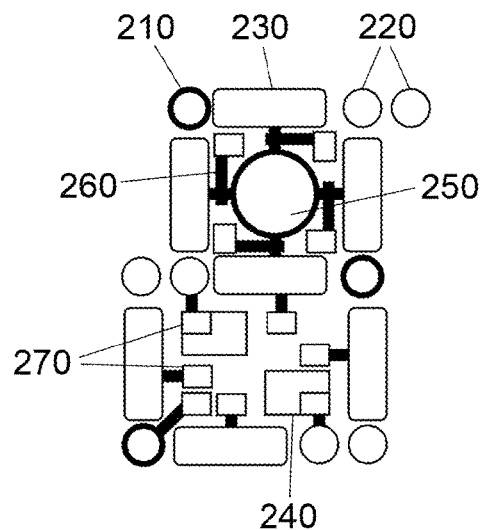
FIG. 6A is an illustration of a "unit cell" of a surface code architecture showing further components to those shown in FIG. 2.
Figure 6B:
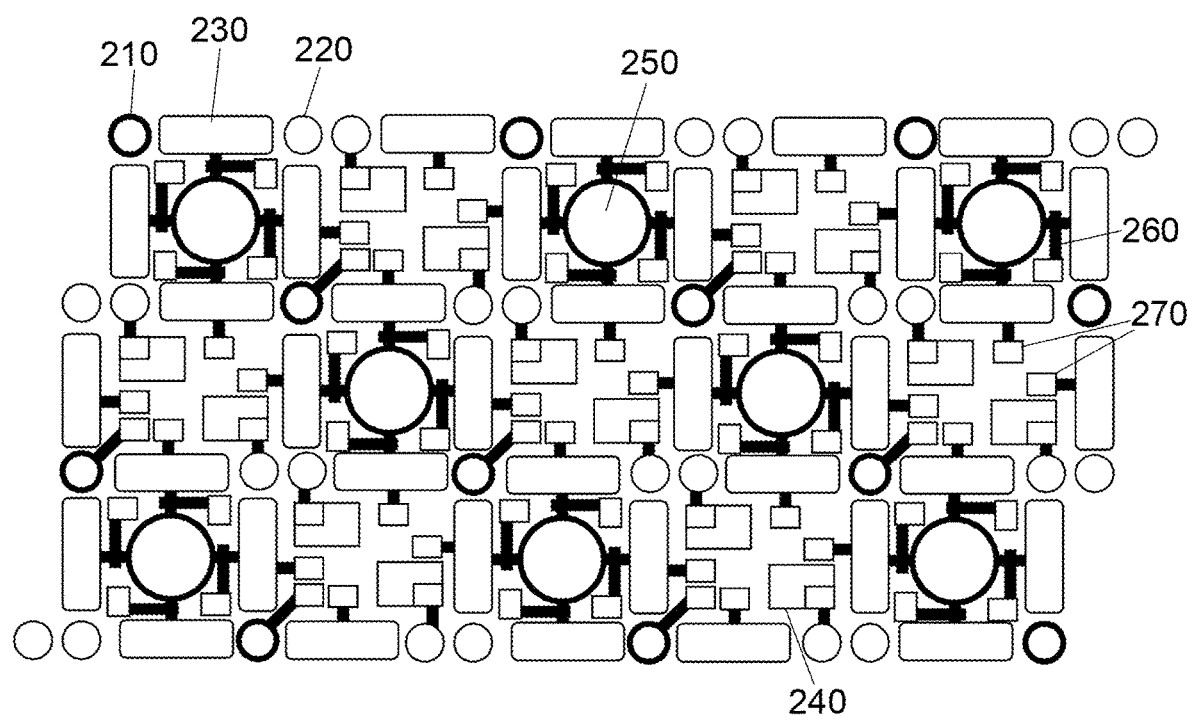
FIG. 6B is an illustration of a surface code architecture formed from multiple unit cells as shown in FIG. 6A.

FIG. 6A illustrates a unit cell of a surface code architecture similar to that of FIG. 2. FIG. 6B shows a surface code grid using the unit cell of FIG. 6A. As can be seen in FIGS. 6A and 6B, the data dots 210 are each positioned next to a mediator dot 230, the other end of which is positioned next to an ancilla dot 220 of the ancilla dot pair. Gate control units 270 and conducting leads 260 are arranged to control each data dot 210, ancilla dot 220, mediator dot 230 and charge reservoir 250. Each ancilla dot 220 is further coupled to a measurement unit 240 (and a gate control unit 270) via a lead 260.

With reference to FIGS. 7A-7G, multiple layers of a device for processing quantum information will now be described. As will be appreciated by the skilled person on reading the present disclosure, such devices may be manufactured using a "multi-layered gate stack" approach. The device is built up in layers. Metal electrodes may be lithographically defined and deposited on a layer. Each electrode layer may subsequently be isolated from the next layer by the deposition or growth of an oxide layer. The skilled person would appreciate that other methods for manufacturing the device may be used.

Figure 7A:
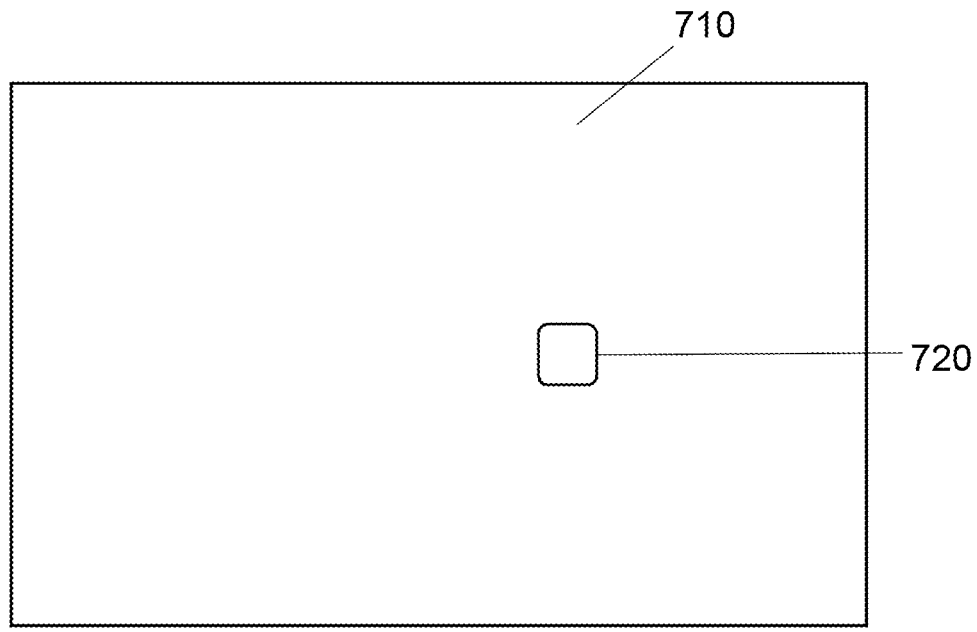
FIG. 7A illustrates a section of a first layer of a device for quantum information processing.
Figure 7B:
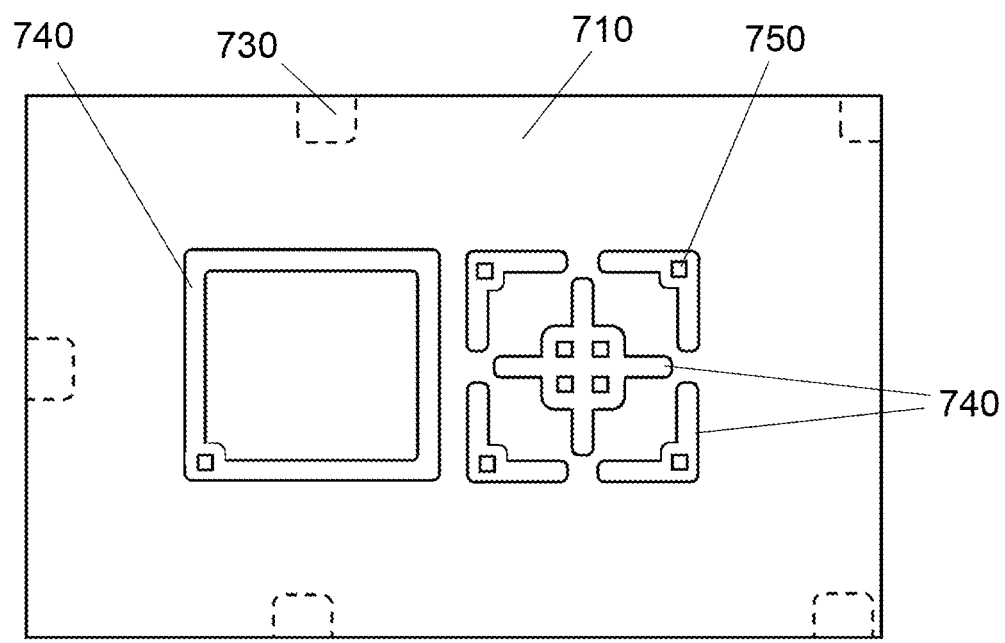
FIG. 7B illustrates a section of a second layer of the device for quantum information processing shown in FIG. 7A.
Figure 7C:
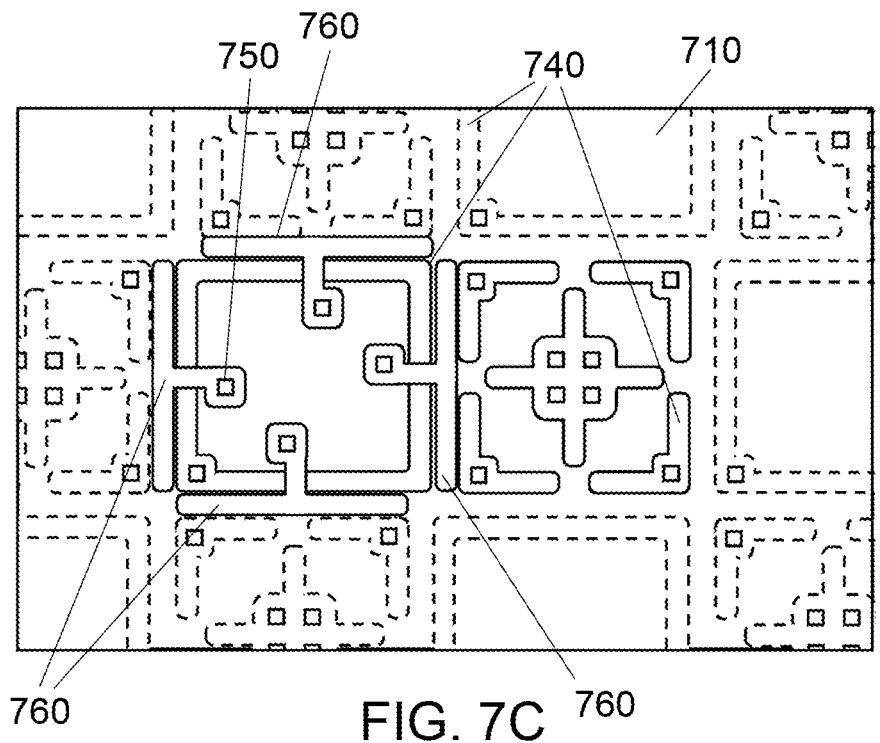
FIG. 7C illustrates a section of a third layer of the device for quantum information processing shown in FIG. 7A.
Figure 7D:
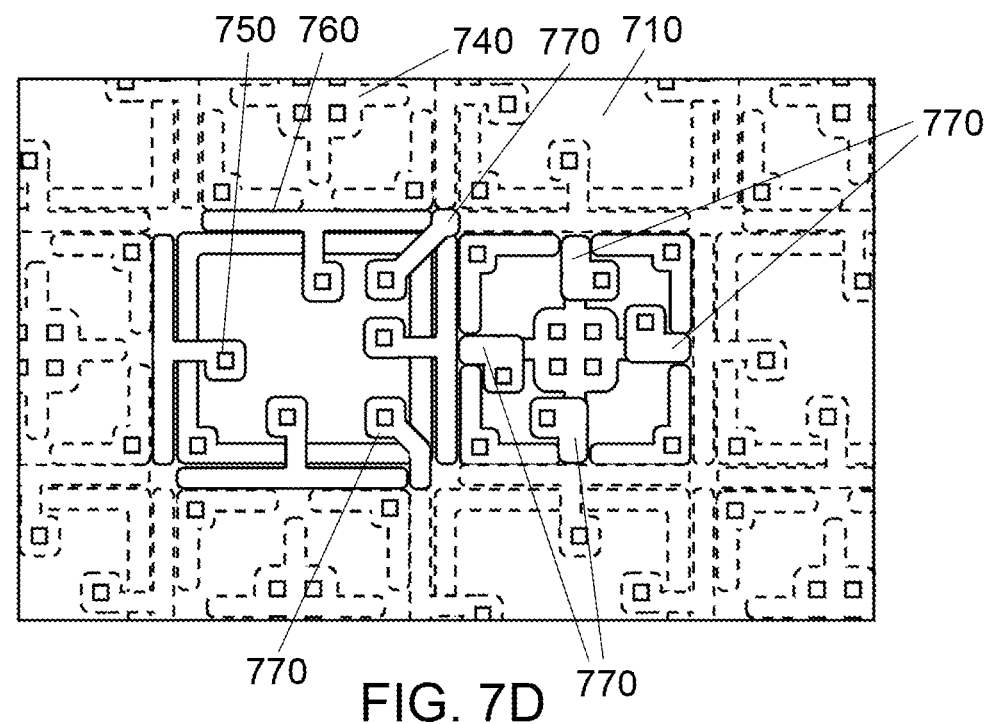
FIG. 7D illustrates a section of a fourth layer of the device for quantum information processing shown in FIG. 7A.
Figure 7E:
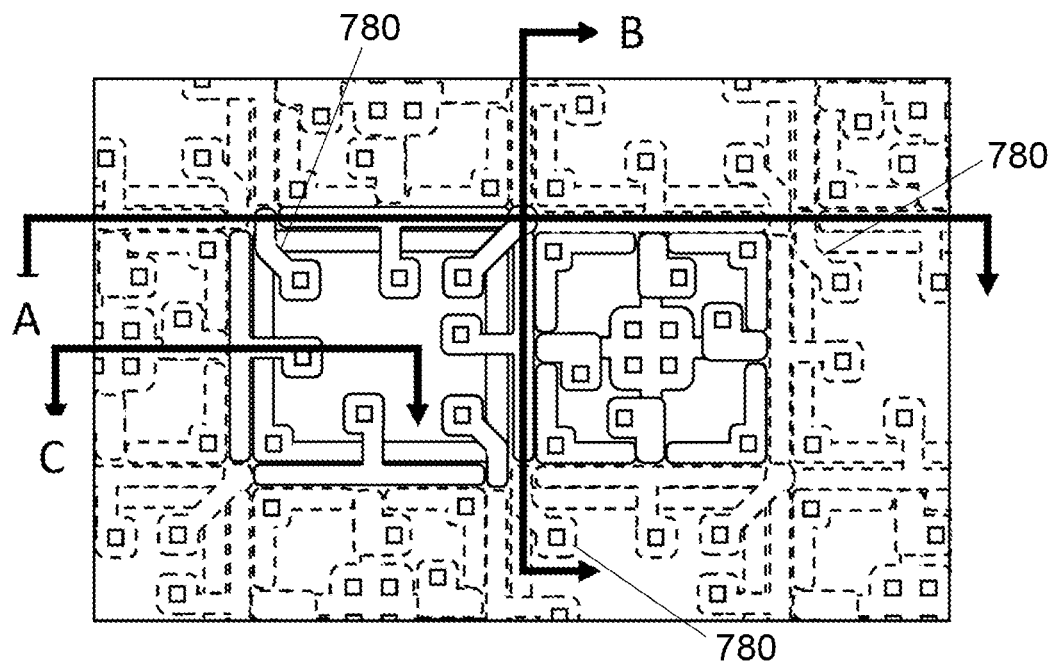
FIG. 7E illustrates a section of a fifth layer of the device for quantum information processing shown in FIG. 7A.

FIGS. 7A-7F illustrate many layers of the CMOS structure as the device is built up in layers. Not every layer is shown (for example, the deposited or grown oxides are not shown). However, the layers are in order from the lowest (FIG. 7A) to the highest (FIG. 7E). Terms such as "lower", "lowest", "higher", "highest", "above" and "below" are purely indicative of the relative positions of the features in the figures. That is, directional terms such as those used herein do not refer to a direction relative to a viewpoint of a user, but instead should be considered in all aspects as relative terms.

The figures focus in particular on a unit cell. In FIGS. 7B-7F, features that do not form part of the central unit cell and that were provided in a previous stage are shown with dashed lines.

FIG. 7A shows a part of a silicon substrate 710. The location for an ohmic implanted region 720 (other ohmic regions are not shown in FIG. 7A) is also depicted, which can in use feed carriers to charge reservoirs 250. A silicon oxide layer is also deposited (not shown) with substantially uniform coverage.

FIG. 7B illustrates a layer higher than that of FIG. 7A. A first conductive layer is deposited in order to define the charge reservoirs 250 and to define the confinement regions. The first conductive layer comprises poly-silicon electrodes 740. The first conductive layer further comprises metal electrodes 750. FIG. 7B also shows contacts 730 deposited from a previous stage (which do not form part of the unit cell). Atomic layer deposition is then used to grow a substantially uniform layer of isolating oxide above the first conductive layer.

Once the polysilicon electrodes 740 and metal electrodes 750, and subsequent isolating oxide layer have been provided to the device, a second conductive layer is provided. In particular, metal electrodes 760 (see FIG. 7C, which shows a layer above that depicted in FIG. 7B) are provided to the device. This second conductive layer helps to define the mediator dots 230. Atomic layer deposition is subsequently used to grow a substantially uniform layer of isolating oxide. Poly-silicon electrodes 740 and metal electrodes 750 not forming part of the unit cell and applied in a lower layer are shown in dashed limes in FIG. 7C.

A third conductive layer, comprising further metal electrodes 770, is also provided (see FIG. 7D, which shows a layer above that depicted in FIG. 7C) in order to define the barriers to the charge reservoirs 250, and to provide electrodes for controlling the data dots 210 and ancilla dots 220. Atomic layer deposition is subsequently used to grow a substantially uniform layer of isolating oxide. Electrodes 740, 750 and 760 not forming part of the unit cell and applied in a lower layer are shown in dashed lines in FIG. 7D.

A fourth conductive layer is provided for defining the mediator dots 230. The fourth conductive layer also includes further metallic electrodes 780 (see FIG. 7E, which shows a layer above that depicted in FIG. 7D). Atomic layer deposition is subsequently used to grow a substantially uniform layer of isolating oxide. Electrodes 740, 750, 760 and 770 not forming part of the unit cell and applied in a lower layer are shown in dashed lines in FIG. 7E.

Figure 7F:
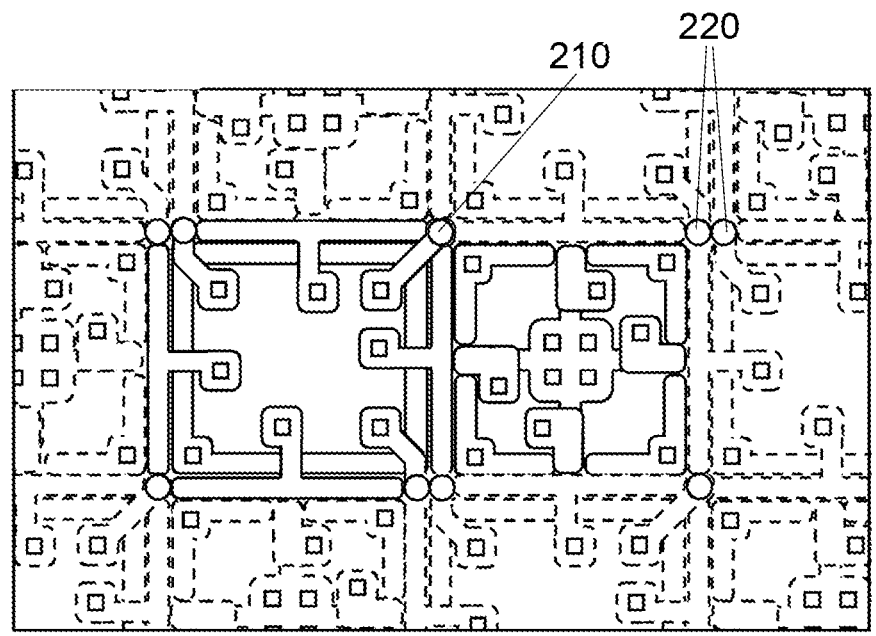
FIG. 7F illustrates the location of quantum dots on the device depicted in FIG. 7E.

FIG. 7F illustrates the location of the data dots 210 and the ancilla dots 220 in the structure of FIG. 7E.

Figure 8A:
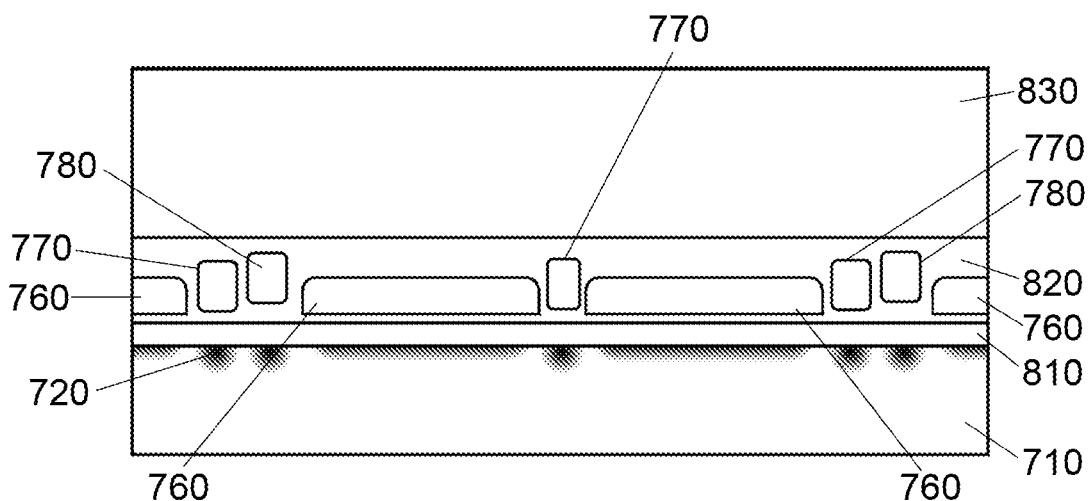
FIG. 8A illustrates a first viewpoint of the device architecture illustrated in FIG. 7E.

FIG. 8A shows a side profile of the structure of FIG. 7E as seen along the direction indicated A in FIG. 7E. Reference numeral 810 indicates a silicon oxide layer (gate layer). Reference numeral 820 indicates an ALD oxide. Reference numeral 830 represents a further silicon oxide layer.

Figure 8B:
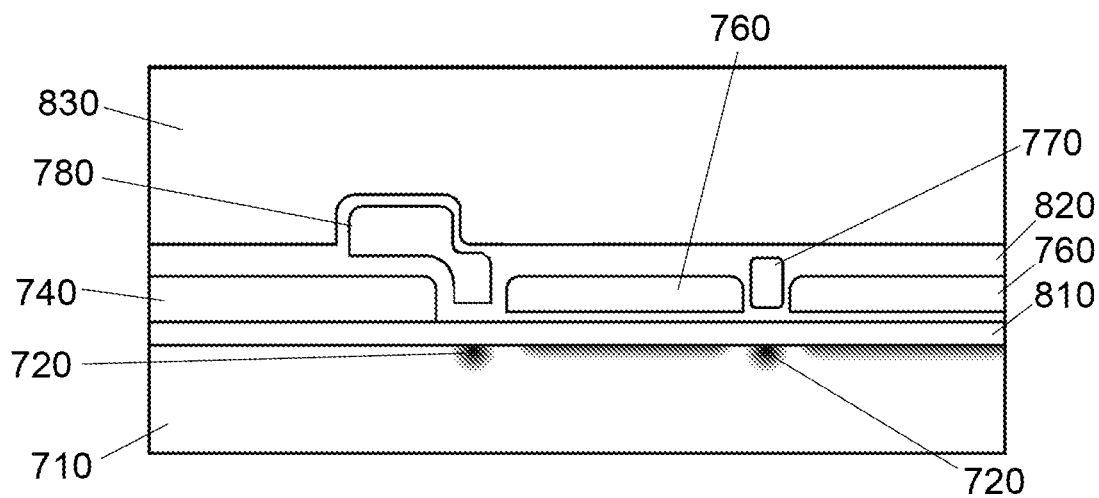
FIG. 8B illustrates a second viewpoint of the device architecture illustrated in FIG. 7E.

FIG. 8B shows a side profile of the structure of FIG. 7E as seen along the direction indicated B in FIG. 7E.

Figure 8C:
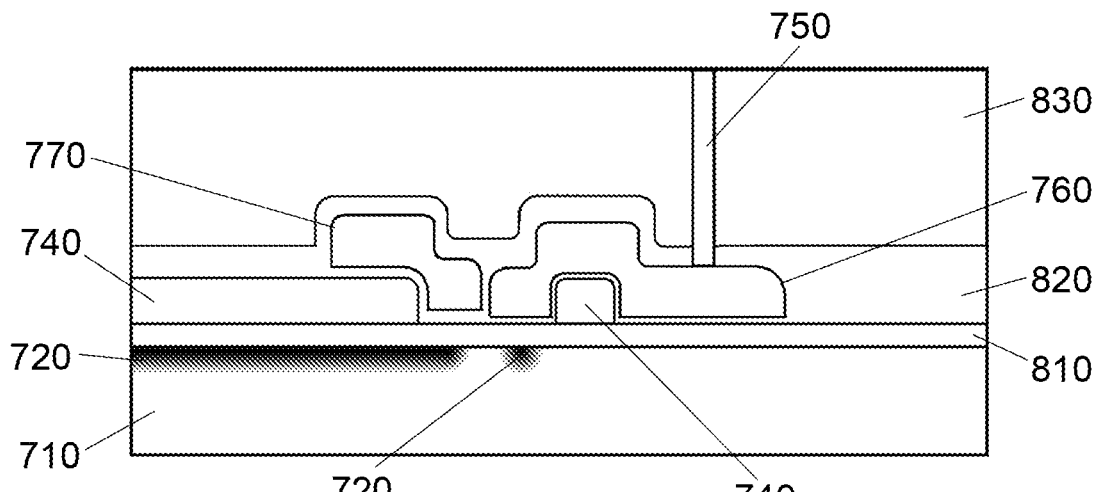
FIG. 8C illustrates a third viewpoint of the device architecture illustrated in FIG. 7E.

FIG. 8C shows a side profile of the structure of FIG. 7E as seen along the direction indicated C in FIG. 7E. Reference numeral 750 indicates a metal via or plug.

Figure 9:
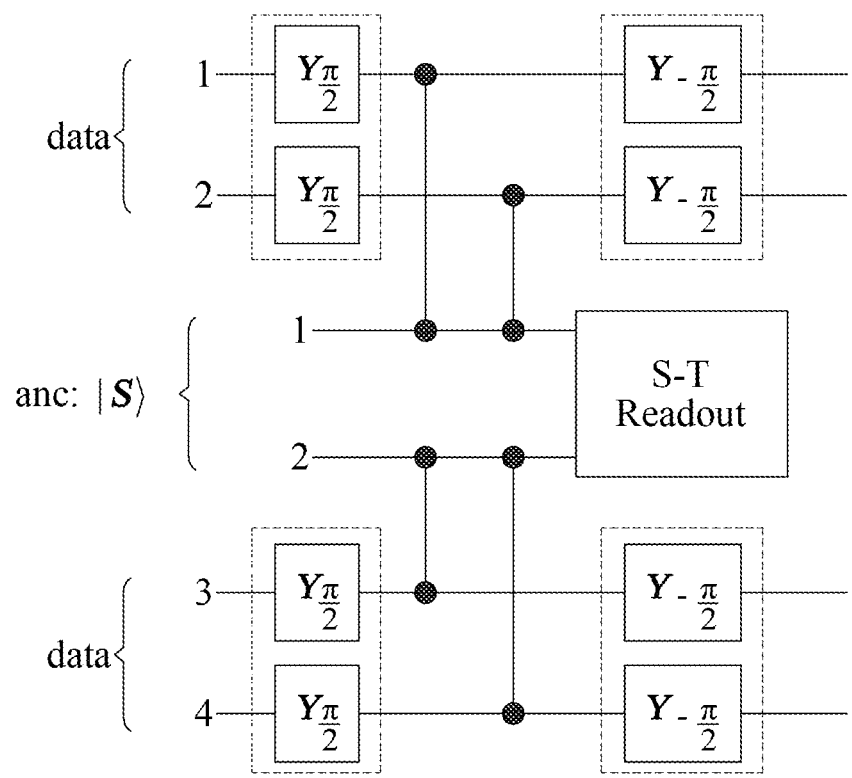
FIG. 9 shows a quantum circuit diagram for implementing a stabiliser check.

A surface code can be implemented by checking X parities and/or Z parities of data qubits of plaquettes of the array 200. The skilled person would appreciate that the term "plaquette" is a term of the art and may be understood in the present example to mean a face formed between four physical data dots 210 of the array 200. These parities are the stabiliser generators of the surface code and are measured using stabiliser-check quantum circuits such as that shown in FIG. 9. The Control-Z gates of FIG. 9 are further decomposed into the quantum circuits of FIG. 4 or FIG. 5, depending on whether micromagnets are positioned in the vicinity of the data dots 210. The $\sqrt{Y}$ operations of FIG. 9 (inside dashed boxes) air included for X stabiliser checks but are not included for Z stabiliser checks. The ancilla double dot 220 is initialised in the singlet state (denoted |S>) and is measured using singlet-triplet spin-dependent tunnelling readout.

Figure 10:
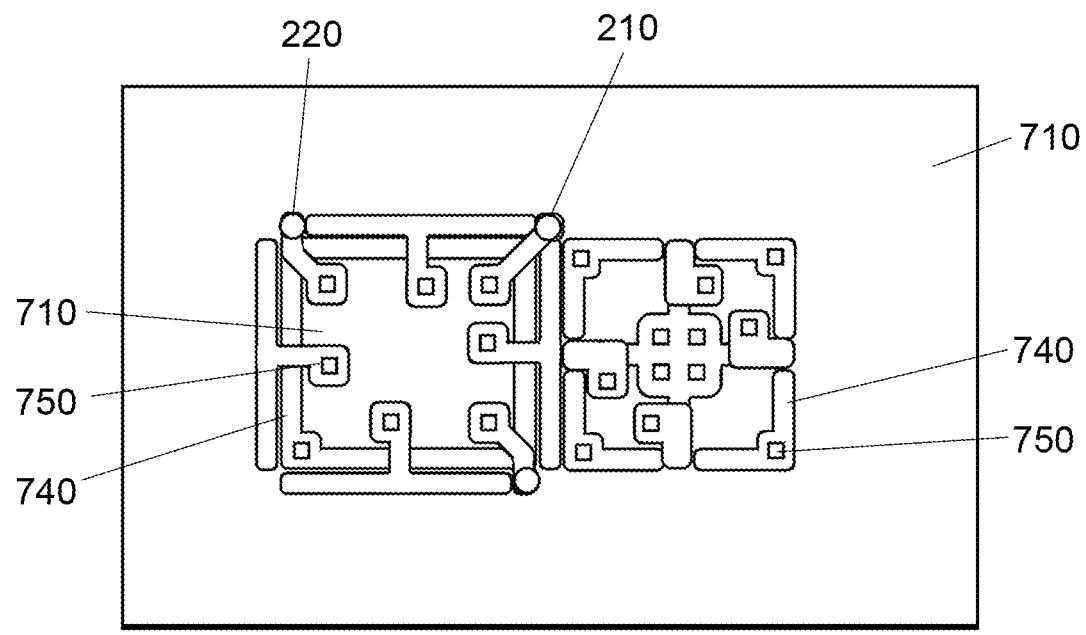
FIG. 10 illustrates a section of another device for quantum information processing, and in particular a unit cell.

FIG. 10 shows a variation on the device unit cell shown in FIG. 7E. In the example shown in FIG. 10, several electrodes are combined into a singled electrode.

Figure 11:
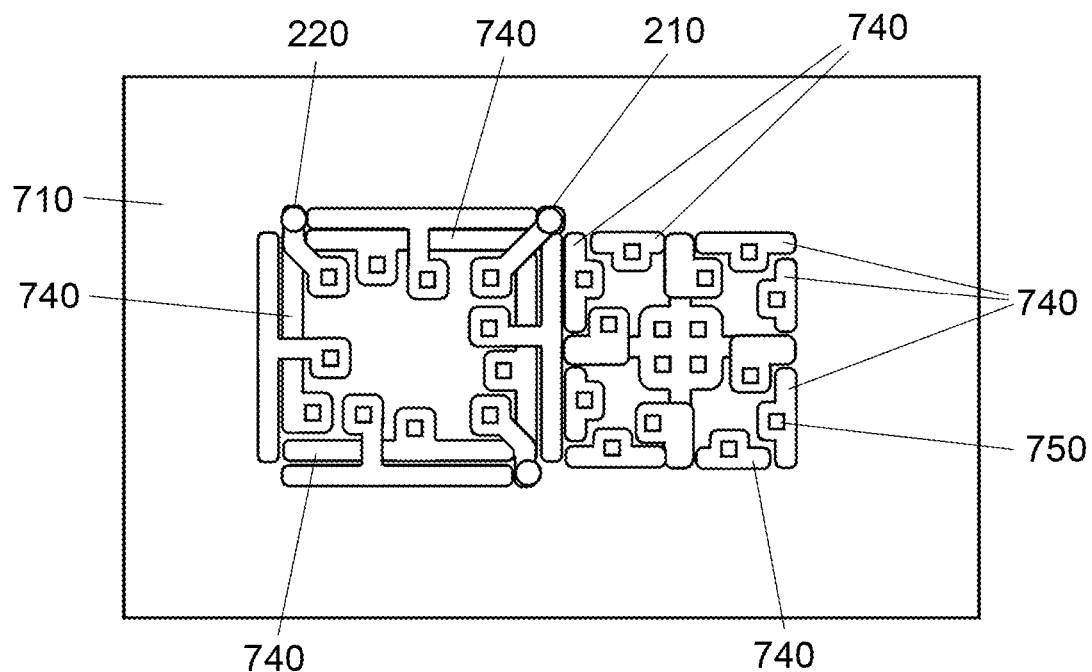
FIG. 11 illustrates a section of another device for quantum information processing, and in particular a unit cell.

FIG. 11 shows a variation on the device unit cell shown in FIG. 7E, for which the electrostatic potential of each quantum dot is highly tunable. In the device of FIG. 11, no electrode is shared between any two mediators.

Figure 12:
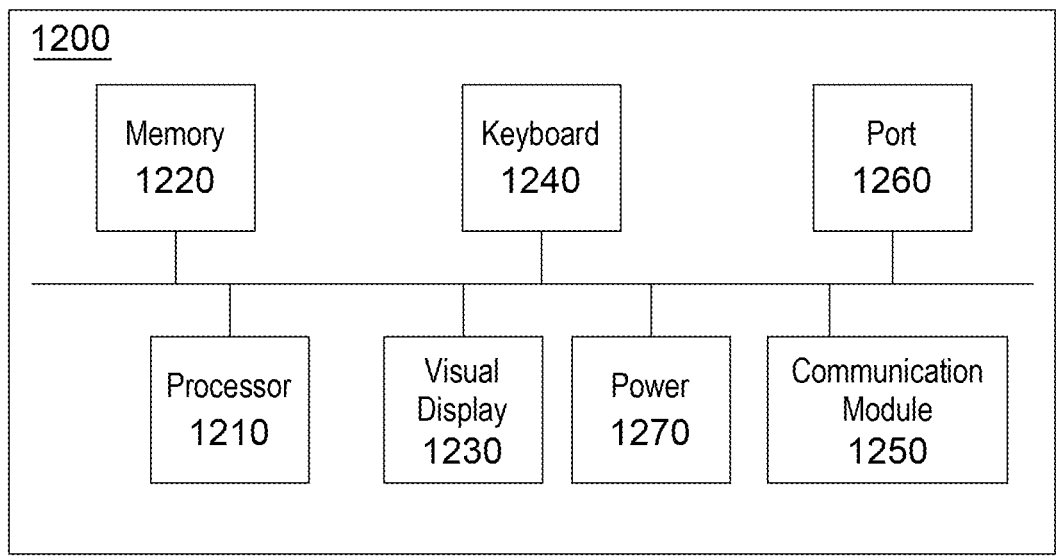
FIG. 12 is a block diagram of a controller.

FIG. 12 is a block diagram of a controller/computing apparatus 1200. For example, computing apparatus 1200 may comprise a computing device. Computing apparatus 1200 may be distributed across multiple connected devices. Other architectures to that shown in FIG. 12 may be used as will be appreciated by the skilled person.

Referring to the figure, controller/computing apparatus 1200 includes one or more processors 1210, one or more memories 1220, a number of optional user interfaces, such as visual display 1230 and virtual or physical keyboard 1240, a communications module 1250, and optionally a port 1260 and optionally a power source 1270 Each of components 1210, 1220, 1230, 1240, 1250, 1260, and 1270 are interconnected using various busses. Processor 1210 can process instructions for execution within the computing apparatus 1200, including instructions stored in memory 1220, received via communications module 1250, or via port 1260.

Memory 1220 is for storing data within computing apparatus 1200. The one or more memories 1220 may include a volatile memory unit or units. The one or more memories may include a non-volatile memory unit or units. The one or more memories 1220 may also be another form of computer-readable medium, such as a magnetic or optical disk. One or more memories 1220 may provide mass storage for the computing apparatus 1200. Instructions for performing a method as described herein may be stored within the one or more memories 1220.

The apparatus 1200 includes a number of user interfaces including visualising means such as a visual display 1230 and a virtual or dedicated user input device such as keyboard 1240.

The communications module 1250 is suitable for sending and receiving communications between processor 1210 and remote systems. For example, communications module 1250 may be used to send and receive communications via a communication network such as the Internet.

The port 1260 is suitable for receiving, for example, a non-transitory computer readable medium containing instruction to be processed by the processor 1210.

The processor 1210 is configured to receive data, access the memory 1220, and to act upon instructions received either from said memory 1220 or a computer-readable storage medium connected to port 1260, film communications module 1250 or from user input device 1240.

The processor 1210 may be configured to cause a magnetic field to be applied to an array 200 in order to separate energy levels of the spin states of the charge carriers in the first and second pluralities of confinement regions. That is the processor 1210 may be configured to cause a magnetic field to be applied to the data dots 210 and ancilla dots 220 in order to remove the degeneracy of the spin states of any electrons stored in those quantum dots. The controller 1200 may further comprise a magnetic field generator for applying the magnetic field to the array 200.

The processor 1210 may be configured to cause an oscillating magnetic field to be applied to the first and second pluralities of confinement regions, the oscillating magnetic field having a frequency substantially matching a Zeeman splitting of the charge carriers. The controller 1210 may further comprise a magnetic field generator for generating the oscillating magnetic field.

The processor 1210 may be configured to cause at least one confinement region of the third plurality of confinement regions to couple with a charge reservoir so as to enable a transfer of a charge carrier between the charge reservoir and the at least one confinement region of the third plurality of confinement regions. For example, the processor may be configured to cause a mediator dot 230 of array 200 to couple with a charge reservoir 250 in order for electron transfer between the mediator dot and charge reservoir to occur. Such an operation may be used to initialise the device for quantum information processing, and to remove errors due to charge carriers being located in the wrong place.

Figure 13:
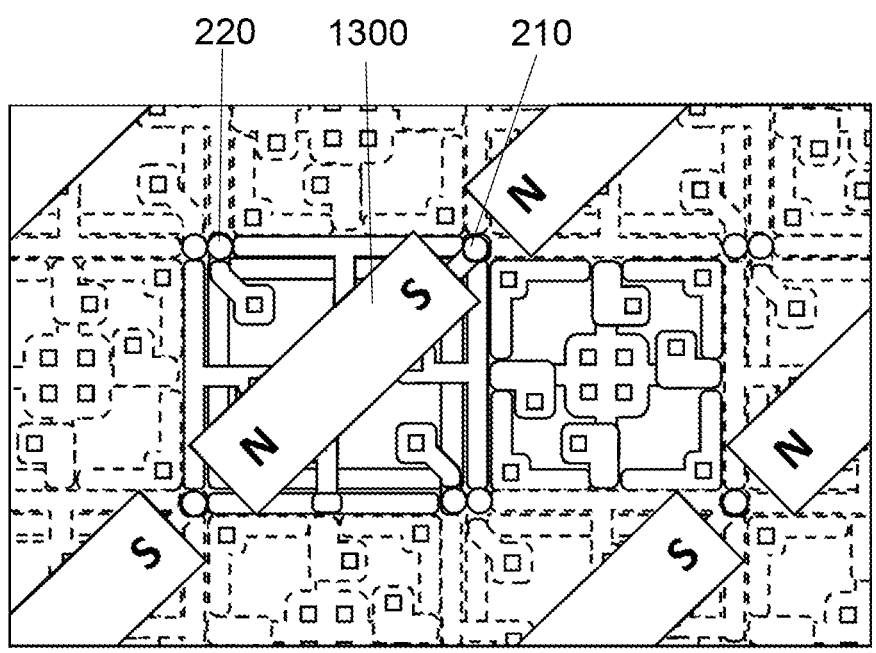
FIG. 13 illustrates a section of another device for quantum information processing and in particular a unit cell, and in particular a unit cell such as that shown in FIG. 7E with the inclusion of magnets.

FIG. 13 shows a variation on the device unit cell shown in FIG. 7E. In particular, in the architecture shown in FIG. 13, suitably sized magnets 1300 (e.g. nanomagnets) have been positioned over the unit cell of FIG. 7E such that the north (N) and south (S) poles of the magnet 1300 are positioned near to data dots 210. The spacing between a north pole of a first magnet 1300 and a south pole of a second magnet 1300 resides over a data dot 210 thereby focusing the magnetic field between the north pole of the first magnet 100 and the south pole of the second magnet over the data dot 210.

As explained above in relation to FIGS. 2, 3 and 5, the inclusion of magnets 1300 enables single-qubit gates to be implemented via electric dipole spin resonance (EDSR). Furthermore, with the architecture shown in FIG. 13, a Control-Z gate can be implemented using the circuit diagram of FIG. 5.

Variations of the described embodiments are envisaged, for example, the features of all of the disclosed embodiments may be combined in any way and/or combination, unless such features are incompatible.

The skilled person would appreciate that the layout shown in the figures may be varied and may not be a two-dimensional grid.

The charge reservoirs may be positioned, for example, at a different depth with the device to the confinement regions.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps ofany method or process so disclosed. The claims should not be construed to cover merely the foregoing embodiments, but also any embodiments which fill within the scope of the claims As the skilled person will appreciate from at least paragraph 0106 and FIGS. 6A and 6B, each mediator dot 230 is coupled directly to a charge reservoir 250 via a conducting lead 260 (i.e. not via intermediate dots such as the data dots 210 or ancilla dots 220). In the specific embodiment in FIGS. 6A and 6B, each charge reservoir 250 is coupled directly to four mediator dots 230.

More specifically, each mediator dot 230 may be selectively coupleable directly to a charge reservoir 250. This may be via a conducting lead 260 or any other form of direct coupling. The mediator dot 230 and/or the charge reservoir 250 may optionally also be coupled to a gate control unit 270, which may be via the conducting lead 260 or any other coupling.

The invention claimed is:

1. A silicon-based device for quantum information processing, the device comprising:
   a first plurality of confinement regions for confining spinful charge carriers for use as data qubits;
   a second plurality of confinement regions for confining spinful charge carriers for use as ancillary qubits, each confinement region of the second plurality of confinement regions couplable to measurement apparatus for measuring an ancillary qubit;
   a third plurality of confinement regions for confining spinful charge carriers, each confinement region of the third plurality of confinement regions situated on a line between a first confinement region of the first plurality of confinement regions and a second confinement region of the second plurality of confinement regions in order to space them apart and for use in mediating interactions between a data qubit of the first confinement region and an ancillary qubit of the second confinement region, the mediated interactions comprising interactions affecting respective data qubits and respective ancillary qubits at substantially the same time to enable coupling interactions between the respective data qubits and the respective ancillary qubits; and
   one or more charge reservoirs;
   wherein each confinement region of the third plurality of confinement regions is couplable to a charge reservoir of the one or more charge reservoirs.

2. A device according to claim 1, wherein each confinement region of the first plurality of confinement regions comprises a quantum dot.

3. A device according to claim 1, wherein each quantum dot of the first plurality of confinement regions has a diameter of between 5 nm and 100 nm.

4. A device according to claim 1, wherein each confinement region of the second plurality of confinement regions comprises a pair of quantum dots.

5. A device according to claim 1, wherein each confinement region of the third plurality of confinement regions comprises a mediator quantum dot for containing one or more spinful charge carriers.

6. A device according to claim 5, wherein the mediator quantum dot comprises an elongated mediator quantum dot.

7. A device according to claim 5, wherein the mediator quantum dot has a first dimension of between 5-100 nm and a second dimension of between 50-1000 nm.

8. A device according to claim 1, wherein:
each confinement region of the third plurality of confinement regions is situated between a first confinement region of the first plurality of confinement regions and a second confinement region of the second plurality of confinement regions; and
wherein the distance between the first confinement region and the second confinement region is between 50 nm and 1000 nm.

9. A device according to claim 1, wherein:
each confinement region of the third plurality of confinement regions is situated between a first confinement region of the first plurality of confinement regions and a second confinement region of the second plurality of confinement regions; and
wherein the distance between the confinement region of the third plurality of confinement regions and the first confinement region of the first plurality of confinement regions is between 0.5 nm and 20 nm; and
wherein the distance between the confinement region of the third plurality of confinement regions and the second confinement region of the second plurality of confinement regions is between 0.5 nm and 20 nm.

10. A device according to claim 1, wherein the spinful charge carriers are electrons.

11. A device according to claim 1, further comprising measurement apparatus, the measurement apparatus configured to measure a state of one or more ancillary qubits.

12. A device according to claim 1, the device for surface code quantum information processing.

13. A device according to claim 1, wherein when a charge carrier escapes from a first confinement region of the first plurality of confinement regions or from a second confinement region of the second plurality of confinement regions, a confinement region of the third plurality of confinement regions is configured to transfer a charge carrier to the first confinement region or to the second confinement region so as to maintain a charge stability across the first plurality of confinement regions and the second plurality of confinement regions.

14. A device according to claim 1, further comprising a magnetic field generator for applying a magnetic field to the first and second pluralities of confinement regions, in order to separate energy levels of the spin states of the charge carriers in the first and second pluralities of confinement regions.

15. A device according to claim 1, further comprising a controller configured to cause an oscillating magnetic field to be applied to the first and second pluralities of confinement regions, the oscillating magnetic field having a frequency substantially matching a Zeeman splitting of the charge carriers in the first plurality of confinement regions.

16. A device according to claim 1, further comprising a controller configured to cause at least one confinement region of the third plurality of confinement regions to couple to a charge reservoir to enable a transfer of a charge carrier between the charge reservoir and the at least one confinement region of the third plurality of confinement regions.

17. A device according to claim 1, further comprising:
a plurality of micromagnets, each micromagnet arranged in proximity to a confinement region of the first plurality of confinement regions; and
a controller for applying an oscillating electric field to the first plurality of confinement regions.

18. A method of operating a device according to claim 1, the method comprising:
causing a confinement region of the third plurality of confinement regions to couple to a charge reservoir of the one or more charge reservoirs to enable a transfer of a charge carrier between the charge reservoir and the at least one confinement region of the third plurality of confinement regions.

19. A method according to claim 18, whereby the causing of the confinement region of the third plurality of confinement regions to couple with a charge reservoir of the one or more charge reservoirs comprises causing the coupling as part of a stabiliser operation on the device.

20. A computer-readable medium having instructions stored thereon which, when executed by a processor, causes the processor to perform the method of claim 18.

* * * * *